US012751043B2

(12) United States Patent
Machida et al.

(10) Patent No.: US 12,751,043 B2
(45) Date of Patent: Sep. 29, 2026

(54) THREE-DIMENSIONAL (3D) TRENCHED METAL-OXIDE-SEMICONDUCTOR FIELD-EFFECT TRANSISTOR (MOSFET) DEVICE INCLUDING FIRST DOPED WELLS AND SECOND DOPED WELLS AND METHOD FOR FABRICATING THE SAME

(71) Applicant: Taipei ANJET Corporation, Taipei City (TW)

(72) Inventors: Nobuo Machida, Kyoto (JP); Wen-Chin Wu, Taipei City (TW)

(73) Assignee: Taipei ANJET Corporation, Taipei City (TW)

( * ) Notice: Subject to any disclaimer, the term of this patent is extended or adjusted under 35 U.S.C. 154(b) by 400 days.

(21) Appl. No.: 18/383,080

(22) Filed: Oct. 24, 2023

(65) Prior Publication Data

US 2025/0133769 A1 Apr. 24, 2025

(51) Int. Cl.
*H10D 30/66* (2025.01)
*H10D 30/01* (2025.01)
*H10D 30/65* (2025.01)
*H10D 64/27* (2025.01)

(52) U.S. Cl.
CPC ....... *H10D 30/668* (2025.01); *H10D 30/0295* (2025.01); *H10D 30/0297* (2025.01); *H10D 30/658* (2025.01); *H10D 64/513* (2025.01)

(58) Field of Classification Search
CPC ............. H10D 30/668; H10D 30/0297; H10D 30/658; H10D 30/513; H10D 62/393; H10D 64/513; H10D 62/127; H01L 21/047
See application file for complete search history.

(56) References Cited

U.S. PATENT DOCUMENTS

| | | | | |
|---|---|---|---|---|
| 8,786,013 | B2 * | 7/2014 | Mathew | H10D 30/668 257/334 |
| 11,984,492 | B2 * | 5/2024 | Ebiike | H10D 30/0291 |
| 2016/0005837 | A1 * | 1/2016 | Cheng | H01L 21/046 438/270 |
| 2016/0104702 | A1 * | 4/2016 | Hsieh | H10D 64/661 257/334 |
| 2021/0111276 | A1 * | 4/2021 | Karmous | H10D 62/127 |
| 2022/0336602 | A1 * | 10/2022 | Moon | H10D 62/8325 |
| 2024/0234567 | A1 * | 7/2024 | Sampath | H10D 30/668 |

* cited by examiner

*Primary Examiner* — Khiem D Nguyen
(74) *Attorney, Agent, or Firm* — Birch, Stewart, Kolasch & Birch, LLP

(57) ABSTRACT

A 3D trenched MOSFET device includes a semiconductor substrate, an epitaxial layer, an epitaxial layer, a doped area, first doped wells, second doped wells, a trenched gate, first heavily-doped areas, a patterned insulation layer, and a conduction layer. The epitaxial layer is formed on the semiconductor substrate. The doped area, the first doped wells, and the second doped wells are formed in the epitaxial layer. The trenched gate, formed in the epitaxial layer and the first doped wells, penetrates through the doped area and surrounds the second doped wells. The bottoms of the first doped wells and the second doped wells are lower than the bottom of the trenched gate. The first heavily-doped areas are formed in the doped area. The first heavily-doped areas respectively surround the second doped wells and the trenched gate surrounds the first heavily-doped areas.

15 Claims, 9 Drawing Sheets

THREE-DIMENSIONAL (3D) TRENCHED METAL-OXIDE-SEMICONDUCTOR FIELD-EFFECT TRANSISTOR (MOSFET) DEVICE INCLUDING FIRST DOPED WELLS AND SECOND DOPED WELLS AND METHOD FOR FABRICATING THE SAME

BACKGROUND OF THE INVENTION

Field of the Invention

The present invention relates to a metal-oxide-semiconductor field-effect transistor (MOSFET) device, particularly to a three-dimensional (3D) trenched metal-oxide-semiconductor field-effect transistor (MOSFET) device.

Description of the Related Art

Conventional silicon-based semiconductor power devices have gradually reached their material limit. Meanwhile, the third-generation semiconductor power devices (represented by SiC-based ones), featuring high working frequency, high working voltage, high working temperature and good radiation resistance, have revealed feasibility for higher power density and higher system efficiency.

As a representative SiC power switching device, SiC trench-gate MOSFET features low switching loss, high working frequency, good drivability and suitability for paralleled use. Nowadays, SiC MOSFET has been gradually popularized and used in electric vehicles, charging piles, new energy power generation, industrial control, flexible DC power transmission and other applications. There are two kinds of MOSFET categorized by cell structures, planar-gate MOSFET and trench-gate MOSFET. Compared with planar-gate MOSFET, trench-gate MOSFET features higher channel mobility and narrower cell pitch, bringing a reduction of device resistance and an increase of current conduction density. However, trench-gate MOSFET is faced with oxide reliability issues. When the trench-gate MOSFET is in a blocking state, its oxide layer at trench bottom is exposed to a high electric field in its drift region. This may lead to dielectric degradation or premature breakdown, resulting in a degraded long-term reliability and lifespan. %

The polygon cellular structure of trenched gate power MOSFETs, such as square and hexagonal topologies are used instead of stripe cell for increasing the cell density for reducing on resistance. The polygon cell has intersecting portions of trenched gate. The gate oxide of the trench gate bottom at the intersecting portions are exposed to a higher electric field in blocking state. This higher electric fields lead to the gate oxide degradation.

To overcome the abovementioned problems, the present invention provides a three-dimensional (3D) trenched metal-oxide-semiconductor field-effect transistor (MOSFET) device, so as to solve the afore-mentioned problems of the prior art.

SUMMARY OF THE INVENTION

The present invention provides a three-dimensional (3D) trenched metal-oxide-semiconductor field-effect transistor (MOSFET) device, which prevents the bottom of a trenched gate from directly exposing to a high electric field applied to a semiconductor substrate as a drain, thereby protecting a gate oxide layer from breakdown and improving long-term reliability and lifespan.

In an embodiment of the present invention, a three-dimensional (3D) trenched metal-oxide-semiconductor field-effect transistor (MOSFET) device is provided. The 3D trenched MOSFET device includes a semiconductor substrate, an epitaxial layer, an epitaxial layer, a doped area, first doped wells, second doped wells, a trenched gate, first heavily-doped areas, a patterned insulation layer, and a conduction layer. The epitaxial layer, having a first conductivity type, is formed on the semiconductor substrate. The doped area, the first doped wells, and the second doped wells, having a second conductivity type opposite to the first conductivity type, are formed in the epitaxial layer. The first doped wells are connected with the second doped wells through the doped area. The trenched gate, formed in the epitaxial layer and the first doped wells, penetrates through the doped area and surrounds the second doped wells. The trenched gate has intersecting portions that are respectively formed in the first doped wells. The bottoms of the first doped wells and the second doped wells are lower than the bottom of the trenched gate. The first heavily-doped areas, having the first conductivity type, are formed in the doped area. The first heavily-doped areas respectively surround the second doped wells and the trenched gate surrounds the first heavily-doped areas. The patterned insulation layer covers the trenched gate to expose the first heavily-doped areas and the second doped wells. The conduction layer is formed on the insulation layer, the first heavily-doped areas, and the second doped wells.

In an embodiment of the present invention, a method for fabricating a three-dimensional (3D) trenched metal-oxide-semiconductor field-effect transistor (MOSFET) device includes: forming an epitaxial layer with a first conductivity type on a semiconductor substrate; forming a doped area with a second conductivity type opposite to the first conductivity type in the epitaxial layer; forming a heavily-doped region with the first conductivity type in the doped area; forming first doped wells and second doped wells with the second conductivity type in the epitaxial layer, wherein the first doped wells and the second doped wells penetrate through the doped area and the heavily-doped region; forming a trenched gate in the epitaxial layer and the first doped wells, wherein the trenched gate penetrates through the doped area and the heavily-doped region and surrounds the second doped wells, thereby forming first heavily-doped areas with the first conductivity type in the doped area, the trenched gate has intersecting portions that are respectively formed in the first doped wells, bottoms of the first doped wells and the second doped wells are lower than a bottom of the trenched gate, the first heavily-doped areas respectively surround the second doped wells, and the trenched gate surrounds the first heavily-doped areas; forming a patterned insulation layer to cover the trenched gate, thereby exposing the first heavily-doped areas and the second doped wells; and forming a conduction layer on the insulation layer, the first heavily-doped areas, and the second doped wells.

To sum up, the 3D trenched MOSFET device forms the first doped wells to cover the bottom of the trenched gate % at the intersecting portion of trenched gate in polygon cells and forms the second doped wells whose bottoms are lower than the bottom of the trenched gate to prevents the bottom of the trenched gate from directly exposing to a high electric field applied to the semiconductor substrate as the drain, thereby protecting the gate oxide layer from breakdown and improving long-term reliability and lifespan.

Below, the embodiments are described in detail in cooperation with the drawings to make easily understood the technical contents, characteristics and accomplishments of the present invention.

DETAILED DESCRIPTION OF THE INVENTION

Figure 1:
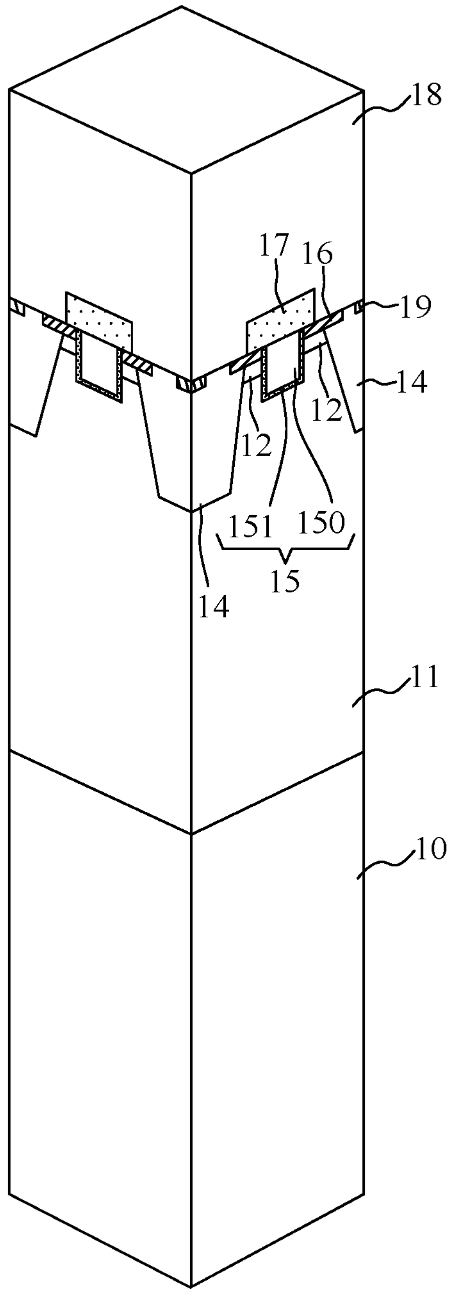
FIG. 1 is a schematic diagram illustrating the three-dimensional (3D) cross-sectional view of a 3D trenched metal-oxide-semiconductor field-effect transistor (MOSFET) device according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

In the following description, a three-dimensional trenched metal-oxide-semiconductor field-effect transistor (MOSFET) device will be provided, which forms first doped wells to cover the bottom of a trenched gate and forms second doped wells whose bottoms are lower than the bottom of the trenched gate to prevents the bottom of the trenched gate from directly exposing to a high electric field applied to a semiconductor substrate as a drain, thereby protecting a gate oxide layer from breakdown and improving long-term reliability and lifespan.

Figure 2:
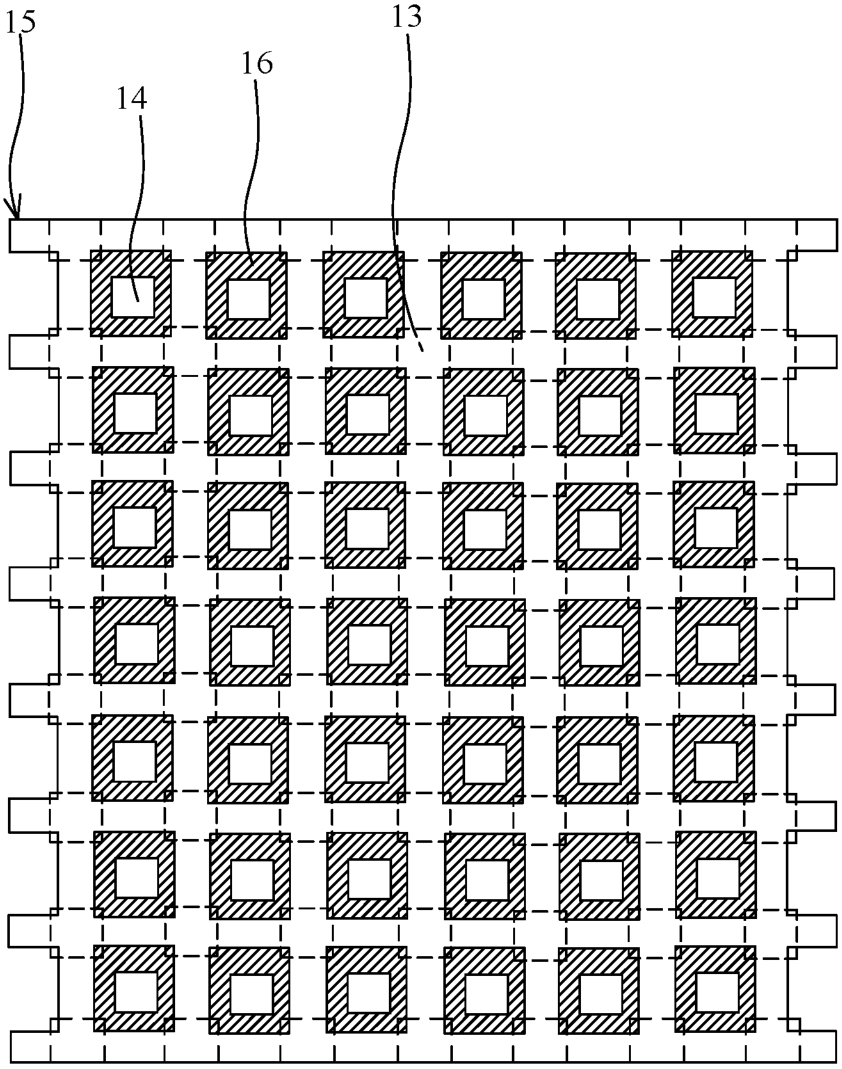
FIG. 2 is a schematic diagram illustrating the circuit layout of a trenched gate, first doped wells, second doped wells, and first heavily-doped areas according to an embodiment of the present invention.
Figure 3:
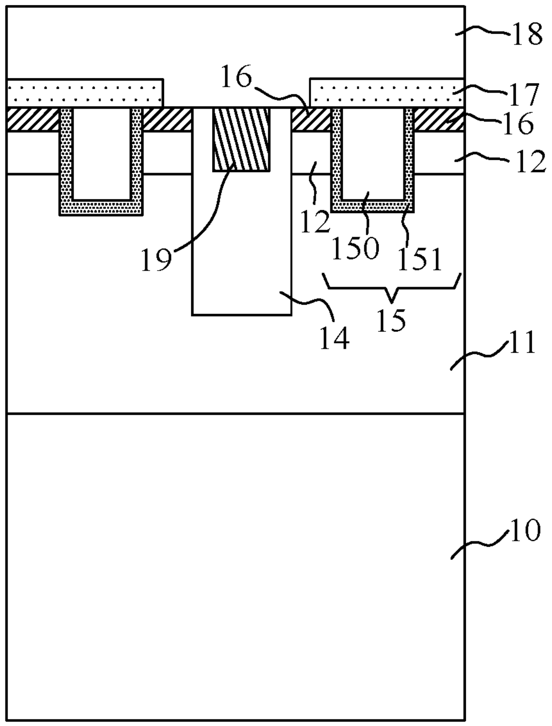
FIG. 3 is a schematic diagram illustrating the two-dimensional (2D) cross-sectional view of a 3D trenched metal-oxide-semiconductor field-effect transistor (MOSFET) device according to an embodiment of the present invention.

FIG. 1 is a schematic diagram illustrating the three-dimensional (3D) cross-sectional view of a 3D trenched metal-oxide-semiconductor field-effect transistor (MOSFET) device according to an embodiment of the present invention. FIG. 2 is a schematic diagram illustrating the circuit layout of a trenched gate, first doped wells, second doped wells, and first heavily-doped areas according to an embodiment of the present invention. FIG. 3 is a schematic diagram illustrating the two-dimensional (2D) cross-sectional view of a 3D trenched metal-oxide-semiconductor field-effect transistor (MOSFET) device according to an embodiment of the present invention.

Referring to FIG. 1, FIG. 2, and FIG. 3, a three-dimensional trenched metal-oxide-semiconductor field-effect transistor (MOSFET) device of the present invention is introduced as follows. The three-dimensional trenched metal-oxide-semiconductor field-effect transistor (MOSFET) device includes a semiconductor substrate 10, an epitaxial layer 11, a doped area 12, first doped wells 13, second doped wells 14, a trenched gate 15, first heavily-doped areas 16, a patterned insulation layer 17, and a conduction layer 18. The first doped wells 13 and the second doped wells 14 may be heavily-doped wells. The semiconductor substrate 10 is used as a drain. The first heavily-doped areas 16 are used as sources. The first doped wells 13 and the second doped wells 14 are used as a body. The epitaxial layer 11, having a first conductivity type, is formed on the semiconductor substrate 10. The doped area 12, the first doped wells 13, and the second doped wells 14, having a second conductivity type opposite to the first conductivity type, is formed in the epitaxial layer 11. The semiconductor substrate 10 has the first conductivity type or the second conductivity type. When the first conductivity type is an N type, the second conductivity type is a P type. When the second conductivity type is an N type, the first conductivity type is a P type. The first doped wells 13 are connected with the second doped wells 14 through the doped area 12. The trenched gate 15, formed in the epitaxial layer 11 and the first doped wells 13, penetrates through the doped area 12 and surrounds the second doped wells 14. The trenched gate 15 has intersecting portions that are respectively formed in the first doped wells 13. The bottoms of the first doped wells 13 and the second doped wells 14 are lower than the bottom of the trenched gate 15. The first heavily-doped areas 16, having the first conductivity type, are formed in the doped area 12. The first heavily-doped areas 16 respectively surround the second doped wells 14 and the trenched gate 15 surrounds the first heavily-doped areas 16. The trenched gate 15 has grids where the second doped wells 14 are respectively formed. In such a case, each of the grids has a shape of a square. Each of the first doped well 13 and the second doped well 14 has a shape of a cube. The patterned insulation layer 17 covers the trenched gate 15 to expose the first heavily-doped areas 16 and the second doped wells 14. The conduction layer 18 is formed on the insulation layer 17, the first heavily-doped areas 16, and the second doped wells 14. The trenched gate 15 may include a gate electrode 150 and a gate oxide layer 151. The gate oxide layer 151 separates each of the epitaxial layer 11, the doped area 12 and the first heavily-doped area 16 from the gate electrode 150. The patterned insulation layer 17 covers the gate electrode 150 and the gate oxide layer 151. In some embodiments, the semiconductor substrate 10 and the epitaxial layer 11 may include, but is not limited to, 4H (hexagonal)-SiC monocrystal. In order to form an ohmic contact, the 3D trenched MOSFET device may further include second heavily-doped areas 19 respectively formed in the second doped wells 14 and electrically connected to the conduction layer 18. The second heavily-doped areas 19 have the second conductivity type. Since the bottoms of the first doped wells 13 and the second doped wells 14 are lower than the bottom of the trenched gate 15, the first doped wells 13 and the second doped wells 14 can prevent the bottom of the trenched gate 15 from directly exposing to a high electric field applied to the semiconductor substrate 10 as the drain, thereby protecting the gate oxide layer 151 from breakdown and improving long-term reliability and lifespan.

Figure 4:
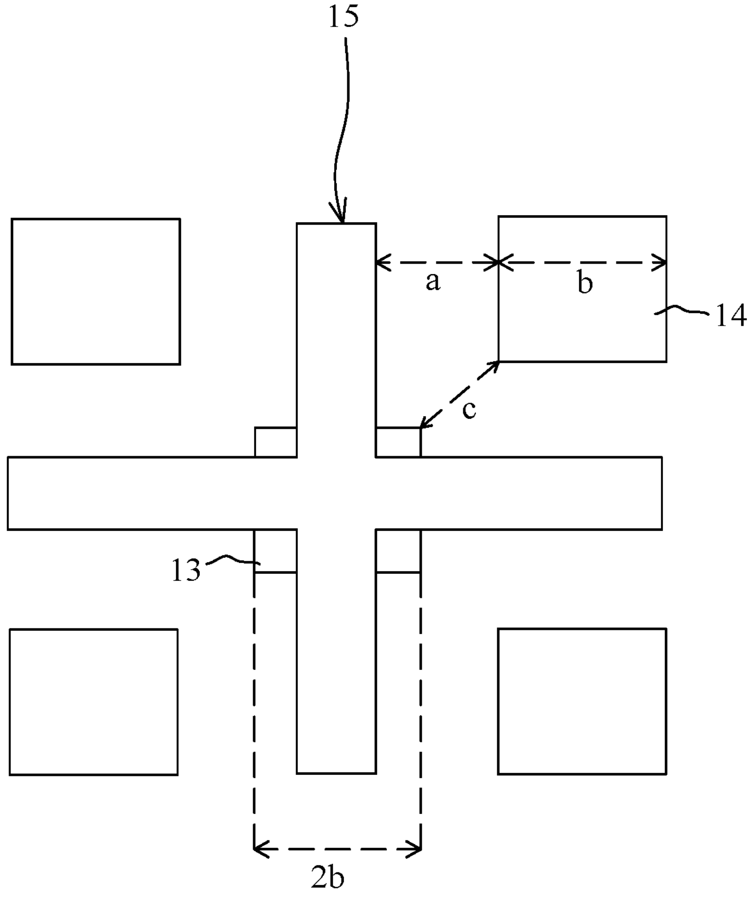
FIG. 4 is a schematic diagram illustrating the circuit layout of a trenched gate, a first doped well, and second doped wells according to an embodiment of the present invention.

FIG. 4 is a schematic diagram illustrating the circuit layout of a trenched gate, a first doped well, and second doped wells according to an embodiment of the present invention. Referring to FIG. 4, a represents a distance between the trenched gate 15 and the second doped well 14, b represents the width of the second doped well 14, and c represents a distance between the corners of the second doped well 14 and the first doped well 13. 2*b* represents the width of the first doped well 13. In a preferred embodiment, a is equal to 0.6 μm, b is equal to 0.9 μm, c is equal to 0.84 μm. Thus, the 3D trenched MOSFET device has a breakdown voltage of 1508 V, a threshold voltage of 2.7 V, and an on resistance of 16.95 mΩ.

Figure 5:
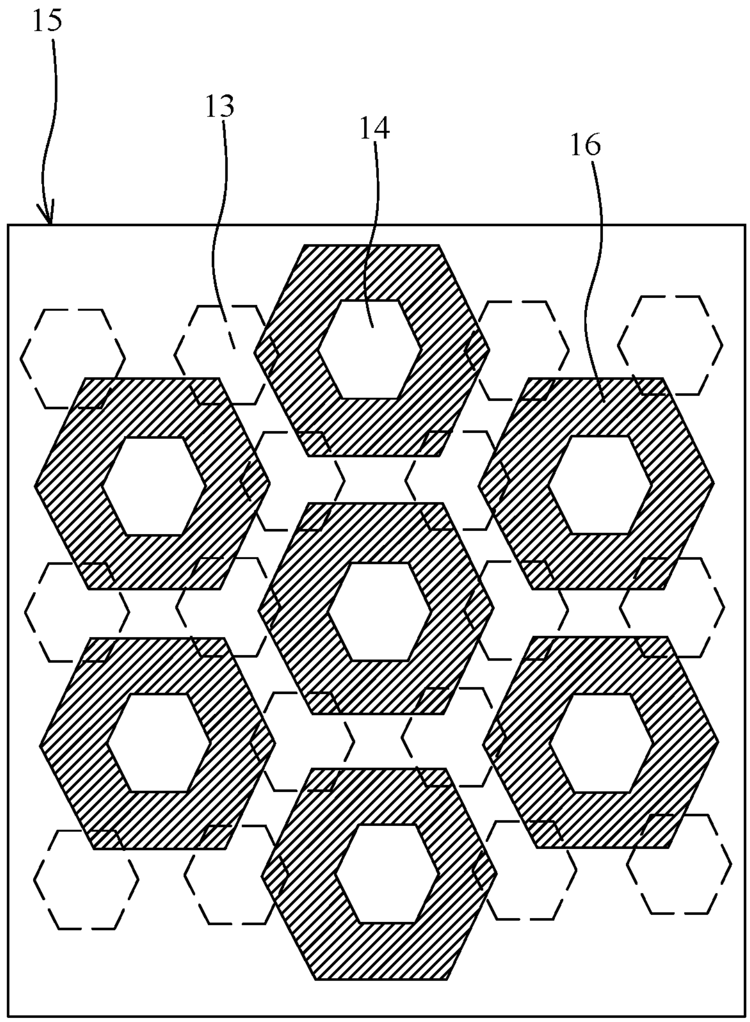
FIG. 5 is a schematic diagram illustrating the circuit layout of a trenched gate, first doped wells, second doped wells, and first heavily-doped areas according to another embodiment of the present invention.
Figure 6A:
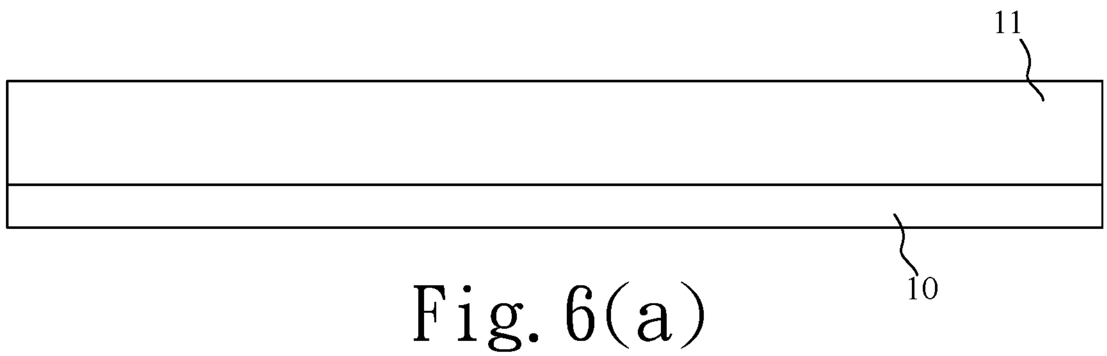
FIGS. 6(*a*)-6(*g*) are schematic diagrams illustrating the steps of fabricating a 3D trenched metal-oxide-semiconductor field-effect transistor (MOSFET) device according to an embodiment of the present invention.
Figure 6B:
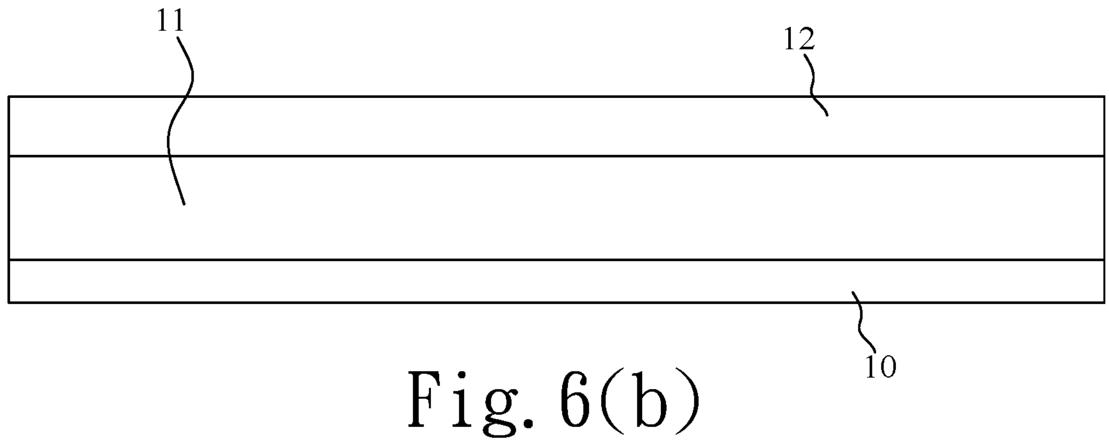
Figure 6C:
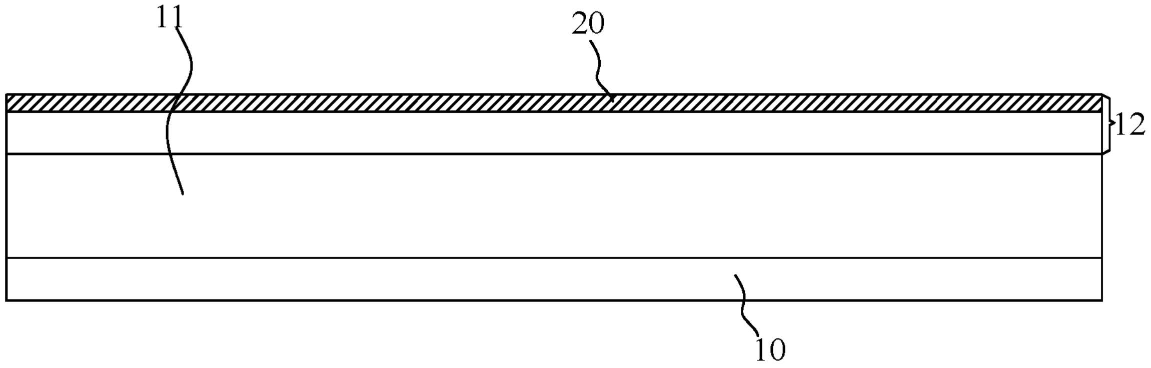
Figure 6D:
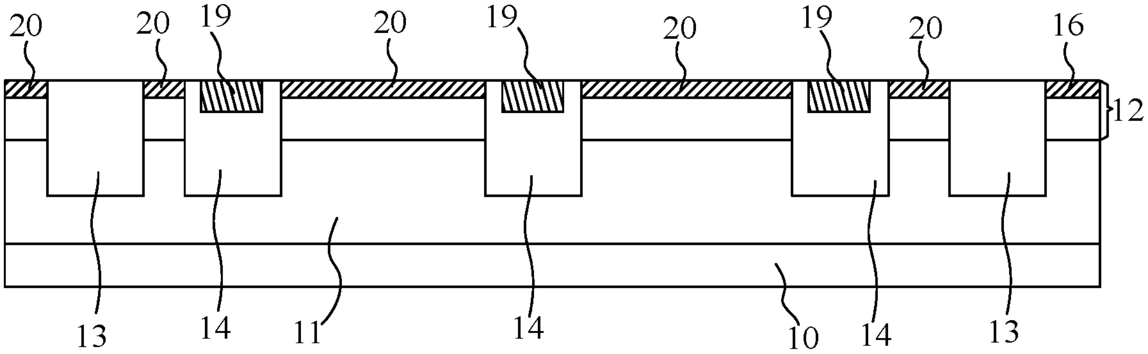
Figure 6E:
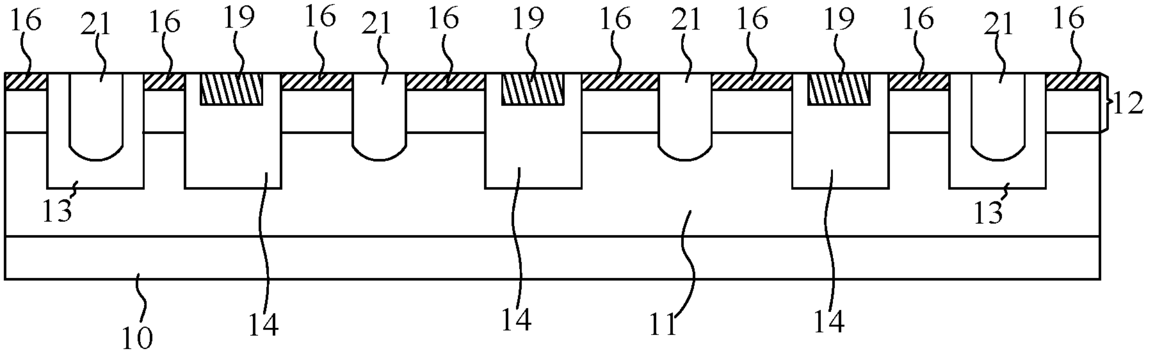
Figure 6F:
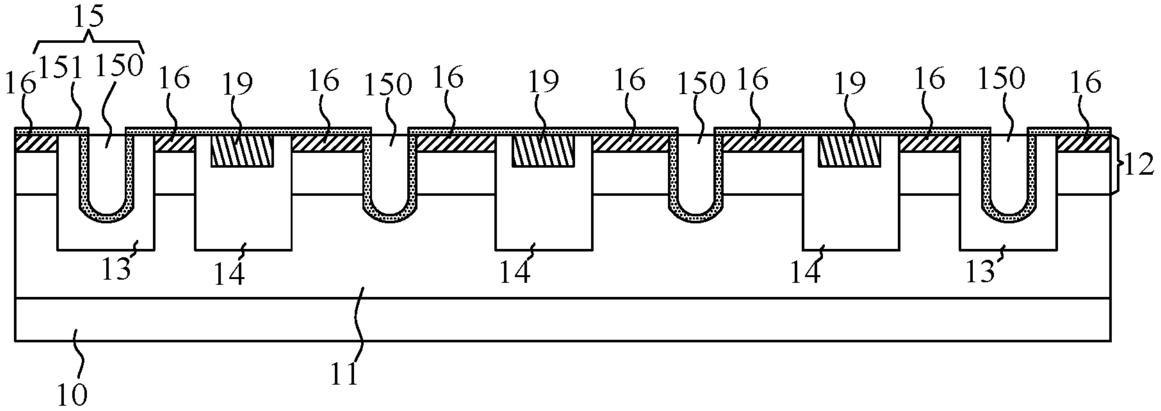
Figure 6G:
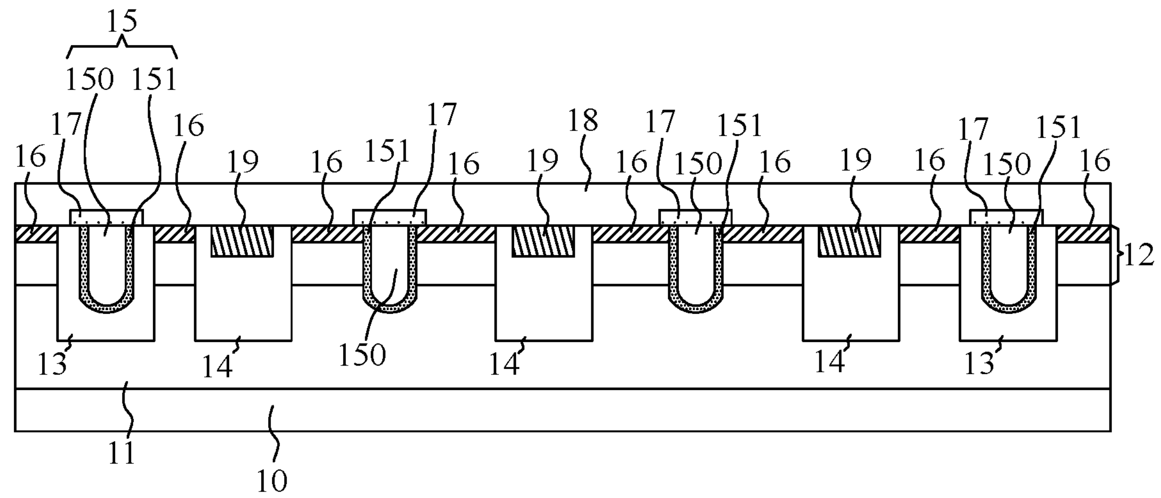

FIG. 5 is a schematic diagram illustrating the circuit layout of a trenched gate, first doped wells, second doped wells, and first heavily-doped areas according to another embodiment of the present invention. Referring to FIG. 5, each of the grids of the trenched gate 15 has a hexagon and each of the first doped well 13 and the second doped well 14 has a shape of a hexagonal column in order to increase the number of the channels of the 3D trenched MOSFET device.

FIGS. 6(*a*)-6(*g*) are schematic diagrams illustrating the steps of fabricating a 3D trenched metal-oxide-semiconductor field-effect transistor (MOSFET) device according to an embodiment of the present invention. Referring to FIGS. 6(*a*)-6(*h*), the method for fabricating the 3D trenched MOSFET is introduced as follows. As illustrated in FIG. 6(*a*), an epitaxial layer 11 with the first conductivity type is formed on a semiconductor substrate 10. As illustrated in FIG. 6(*b*), a doped area 12 with the second conductivity type opposite to the first conductivity type is formed in the epitaxial layer 11. As illustrated in FIG. 6(*c*), a heavily-doped region 20 with the first conductivity type is formed in the doped area 12. As illustrated in FIG. 6(*d*), first doped wells 13 and second doped wells 14 with the second conductivity type are formed in the epitaxial layer 11. The first doped wells 13 and the second doped wells 14 penetrate through the doped area 12 and the heavily-doped region 20. After forming the second doped wells 14, second heavily-doped areas 19 are respectively formed in the second doped wells 14. As illustrated in FIGS. 6(*d*)-6(*e*), a trench 21 that penetrates through the doped area 12 and the heavily-doped region 20 and surrounds the second doped wells 14 is formed in the epitaxial layer 11 and the first doped wells 13, thereby forming first heavily-doped areas 16 with the first conductivity type in the doped area 12. The trench 21 has intersecting portions that are respectively formed in the first doped wells 13. The bottoms of the first doped wells 13 and the second doped wells 14 are lower than the bottom of the trench 21. The trench 21 surrounds the first heavily-doped areas 16. As illustrated in FIGS. 6(*e*)-6(*f*), a gate oxide layer 151 is formed in the trench 21 and on the first heavily-doped areas 16, the first doped wells 13, and the second doped wells 14. Then, a gate electrode 150 is formed on the gate oxide layer 151 in the trench 21. As illustrated in FIG. 6(*g*), the gate oxide layer 151 on the first heavily-doped areas 16, the first doped wells 13, and the second doped wells 14 is removed to form the trenched gate 15 in the epitaxial layer 11 and the first doped wells 13. Then, a patterned insulation layer 17 is formed to cover the trenched gate 15, thereby exposing the first heavily-doped areas 16, the second doped wells 14, and the second heavily-doped areas 19. Finally, a conduction layer 18 is formed on the patterned insulation layer 18, the first heavily-doped areas 16, the second doped wells 14, and the second heavily-doped areas 19.

In some embodiments, the steps of forming the gate electrode 151 and the gate oxide layer 150 may be replaced by the step of forming the trenched gate 15 in the epitaxial layer 11 and the first doped wells 13. The trenched gate 15 penetrates through the doped area 12 and the heavily-doped region 20 and surrounds the second doped wells 14, thereby forming the first heavily-doped areas 16 in the doped area 12. The trenched gate 15 has intersecting portions that are respectively formed in the first doped wells 13. The bottoms of the first doped wells 13 and the second doped wells 14 are lower than the bottom of the trenched gate 15. The first heavily-doped areas 16 respectively surround the second doped wells 14. The trenched gate 15 surrounds the first heavily-doped areas 16. On the top of that, the step of respectively forming the second heavily-doped areas 19 in the second doped wells 14 can be omitted.

Each doped layer is formed by ion implantation and subsequent high temperature thermal annealing. Deep doped layer is effectively formed by using channeling ion implantation. When performing channeling implantation on a 4H—SiC wafer, it is commonly necessary to apply a certain tilting angle along the axis parallel to the macroscopic growth direction of the wafer. This angle is known as the "tilt angle." This requirement arises due to the structural characteristics of the 4H—SiC wafer. The arrangement of carbon and silicon atoms in the crystal structure of 4H—SiC forms a hexagonal lattice. The 4H—SiC wafer has a relatively flat basal plane referred to as the (0001) plane. However, practical 4H—SiC wafers often exhibit some degree of wafer tilt, meaning there is an angular deviation between the wafer surface and the (0001) plane. This tilt has implications for the channeling implantation process, which involves implanting specific ions into the wafer to change the crystal structure's properties. During channeling implantation, the over-tilted wafer can influence the direction of ion beam propagation, resulting in non-uniformity in the injection position and depth of the ions. To address this issue, it's typically necessary to correct the wafer's tilt angle. For 4H—SiC wafers, a common practice is to tilt the channeling injection direction by about 4 degrees. This means that the injection direction is inclined relative to the axis perpendicular to the wafer surface. Owning to the tilt-angle correction, the injection positions become more uniform and accurate. This ensures that the injected ions can effectively traverse the crystal structure, achieving the desired implantation effect. The tilt-angle correction guarantees the consistent characteristics and performance of semiconductor devices during the fabrication process. In summary, due to the crystal structure characteristics of 4H—SiC wafers, it's often necessary to apply a certain tilt-angle correction during the channeling implantation process to ensure the uniformity and consistency of the implantation. This correction enhances process controllability, ensuring that the final devices exhibit the expected performance.

Figure 7:
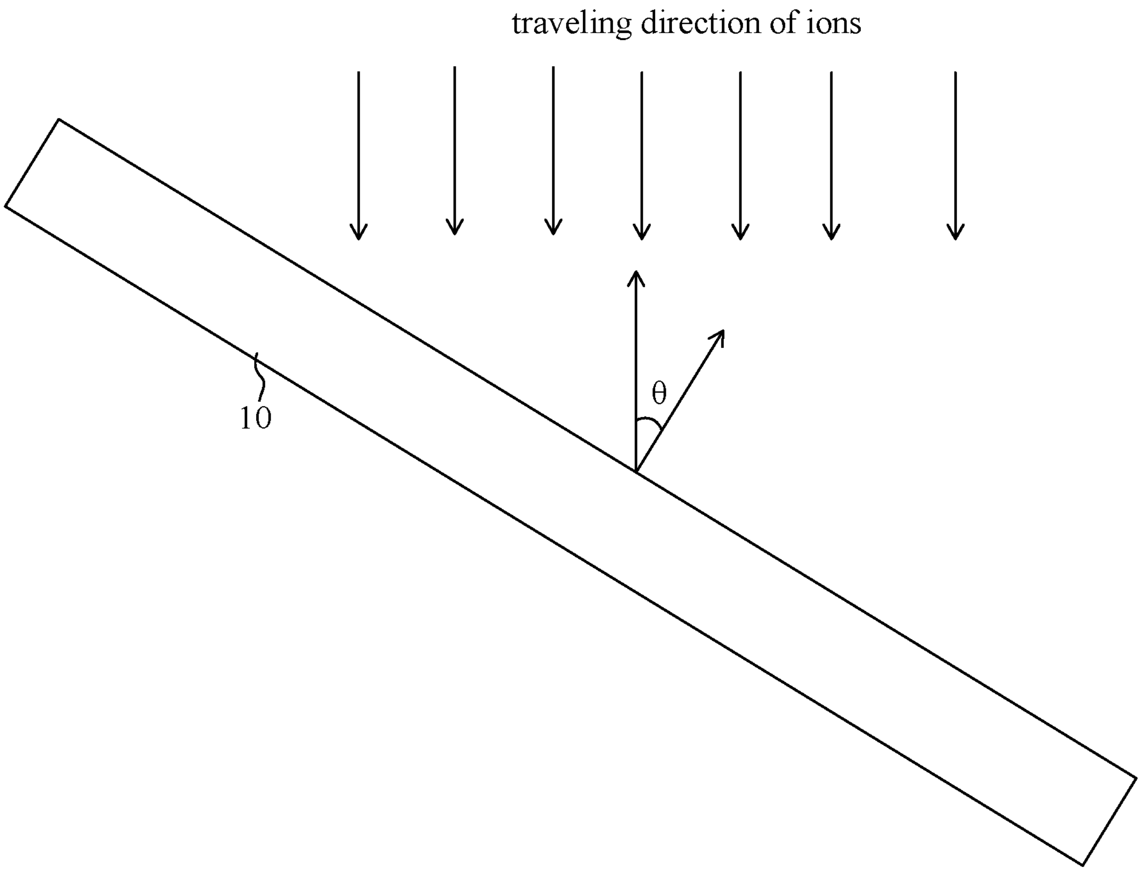
FIG. 7 is a schematic diagram illustrating a semiconductor substrate tilted to align the macroscopic growth direction of the semiconductor substrate parallel to the traveling directions of ions according to an embodiment of the present invention.

FIG. 7 is a schematic diagram illustrating a semiconductor substrate tilted to align the macroscopic growth direction of the semiconductor substrate parallel to the traveling directions of ions according to an embodiment of the present invention. Referring to FIG. 7, the semiconductor substrate 10 needs to be tilted to align the macroscopic growth direction of the semiconductor substrate 10 parallel to the traveling directions of ions in order to guarantees the consistent characteristics and performance of the 3D trenched MOSFET. An angle θ is included between the macroscopic growth direction of the semiconductor substrate 10 and a direction perpendicular to the surface of the semiconductor substrate 10. In a preferred embodiment, the angle θ is 4 degrees. As illustrated in FIG. 6(*c*), in the step of forming the heavily-doped region 20 in the doped area 12, the semiconductor substrate 10 is tilted to align the macroscopic growth direction of the semiconductor substrate 10 parallel to the traveling directions of first ions with the first conductivity type and the first ions are implanted into the doped area 12 to form the heavily-doped region 20. As illustrated in FIG. 6(*b*) and FIG. 6(*d*), in the step of forming the doped area 12, the first doped wells 13, and the second doped wells 14 in the epitaxial layer 11, the semiconductor substrate 10 is tilted to align the macroscopic growth direction of the semiconductor substrate 10 parallel to the traveling directions of second ions with the second conductivity type and the second ions are implanted into the epitaxial layer 11 to form the doped area 12, the first doped wells 13, and the second doped wells 14. Besides, after forming the heavily-doped region 20, the doped area 12, the first doped wells 13, and the second doped wells 14, the heavily-doped region 20, the doped area 12, the first doped wells 13, and the second doped wells 14 may be annealed at 1600-1700° C. to uniform their ion concentration.

According to the embodiments provided above, the 3D trenched MOSFET device forms the first doped wells to cover the bottom of the trenched gate and forms the second doped wells whose bottoms are lower than the bottom of the trenched gate to prevents the bottom of the trenched gate from directly exposing to a high electric field applied to the semiconductor substrate as the drain, thereby protecting the gate oxide layer from breakdown and improving long-term reliability and lifespan.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A three-dimensional (3D) trenched metal-oxide-semiconductor field-effect transistor (MOSFET) device comprising:

a semiconductor substrate;

an epitaxial layer, having a first conductivity type, formed on the semiconductor substrate;

a doped area, first doped wells, and second doped wells, having a second conductivity type opposite to the first conductivity type, formed in the epitaxial layer, wherein the first doped wells are connected with the second doped wells through the doped area;

a trenched gate, formed in the epitaxial layer and the first doped wells, penetrating through the doped area and surrounding the second doped wells, wherein the trenched gate has intersecting portions that are respectively formed in the first doped wells and bottoms of the first doped wells and the second doped wells are lower than a bottom of the trenched gate;

first heavily-doped areas, having the first conductivity type, formed in the doped area, wherein the first heavily-doped areas respectively surround the second doped wells and the trenched gate surrounds the first heavily-doped areas;

a patterned insulation layer covering the trenched gate to expose the first heavily-doped areas and the second doped wells; and a conduction layer formed on the patterned insulation layer, the first heavily-doped areas, and the second doped wells;

wherein the doped area is directly connected with the first doped wells.

2. The 3D trenched MOSFET device according to claim 1, wherein the trenched gate comprises a gate electrode and a gate oxide layer, the gate oxide layer separates each of the epitaxial layer, the doped area and the first heavily-doped area from the gate electrode, and the patterned insulation layer covers the gate electrode and the gate oxide layer.

3. The 3D trenched MOSFET device according to claim 1, further comprising second heavily-doped areas respectively formed in the second doped wells and electrically connected to the conduction layer, wherein the second heavily-doped areas have the second conductivity type.

4. The 3D trenched MOSFET device according to claim 1, wherein each of the first doped well and the second doped well has a shape of a cube or a hexagonal column.

5. The 3D trenched MOSFET device according to claim 1, wherein the first conductivity type is an N type and the second conductivity type is a P type.

6. The 3D trenched MOSFET device according to claim 1, wherein the first conductivity type is a P type and the second conductivity type is an N type.

7. The 3D trenched MOSFET device according to claim 1, wherein the semiconductor substrate and the epitaxial layer comprise 4H (hexagonal)-SiC monocrystal.

8. A method for fabricating a three-dimensional (3D) trenched metal-oxide-semiconductor field-effect transistor (MOSFET) device comprising:

forming an epitaxial layer with a first conductivity type on a semiconductor substrate;

forming a doped area with a second conductivity type opposite to the first conductivity type in the epitaxial layer;

forming a heavily-doped region with the first conductivity type in the doped area;

forming first doped wells and second doped wells with the second conductivity type in the epitaxial layer, wherein the first doped wells and the second doped wells penetrate through the doped area and the heavily-doped region;

forming a trenched gate in the epitaxial layer and the first doped wells, wherein the trenched gate penetrates through the doped area and the heavily-doped region and surrounds the second doped wells, thereby forming first heavily-doped areas with the first conductivity type in the doped area, the trenched gate has intersecting portions that are respectively formed in the first doped wells, bottoms of the first doped wells and the second doped wells are lower than a bottom of the trenched gate, the first heavily-doped areas respectively surround the second doped wells, and the trenched gate surrounds the first heavily-doped areas;

forming a patterned insulation layer to cover the trenched gate, thereby exposing the first heavily-doped areas and the second doped wells; and forming a conduction layer on the patterned insulation layer, the first heavily-doped areas, and the second doped wells;

wherein the doped area is directly connected with the first doped wells.

9. The method for fabricating the 3D trenched MOSFET device according to claim 8, wherein the step of forming the trenched gate in the epitaxial layer and the first doped wells comprises:

forming in the epitaxial layer and the first doped wells a trench that penetrates through the doped area and the heavily-doped region and surrounds the second doped wells, wherein the trench has intersecting portions that are respectively formed in the first doped wells, the bottoms of the first doped wells and the second doped wells are lower than a bottom of the trench, and the trench surrounds the first heavily-doped areas;

forming a gate oxide layer in the trench and on the first heavily-doped areas, the first doped wells, and the second doped wells;

forming a gate electrode on the gate oxide layer in the trench; and removing the gate oxide layer on the first heavily-doped areas, the first doped wells, and the second doped wells to form the trenched gate in the epitaxial layer and the first doped wells.

10. The method for fabricating the 3D trenched MOSFET device according to claim 8, wherein after the step of forming the second doped wells, second heavily-doped areas having the second conductivity type are respectively formed in the second doped wells; in the step of forming the patterned insulation layer to cover the trenched gate, the patterned insulation layer is formed to cover the trenched gate, thereby exposing the first heavily-doped areas, the second doped wells, and the second heavily-doped areas; and in the step of forming the conduction layer on the patterned insulation layer, the first heavily-doped areas, and the second doped wells, the conduction layer is formed on the patterned insulation layer, the first heavily-doped areas, the second doped wells, and the second heavily-doped areas.

11. The method for fabricating the 3D trenched MOSFET device according to claim 8, wherein each of the first doped well and the second doped well has a shape of a cube or a hexagonal column.

12. The method for fabricating the 3D trenched MOSFET device according to claim 8, wherein in the step of forming the heavily-doped region in the doped area, the semiconductor substrate is tilted to align a macroscopic growth direction of the semiconductor substrate parallel to traveling directions of first ions with the first conductivity type and the first ions are implanted into the doped area to form the heavily-doped region; in the step of forming the doped area, the first doped wells, and the second doped wells in the epitaxial layer, the semiconductor substrate is tilted to align a macroscopic growth direction of the semiconductor substrate parallel to traveling directions of second ions with the second conductivity type and the second ions are implanted into the epitaxial layer to form the doped area, the first doped wells, and the second doped wells; and after forming the heavily-doped region, the doped area, the first doped wells, and the second doped wells, the heavily-doped region, the doped area, the first doped wells, and the second doped wells are annealed.

13. The method for fabricating the 3D trenched MOSFET device according to claim 8, wherein the first conductivity type is an N type and the second conductivity type is a P type.

14. The method for fabricating the 3D trenched MOSFET device according to claim 8, wherein the first conductivity type is a P type and the second conductivity type is an N type.

15. The method for fabricating the 3D trenched MOSFET device according to claim 8, wherein the semiconductor substrate and the epitaxial layer comprise 4H (hexagonal)-SiC monocrystal.

* * * * *